(12) United States Patent
Kim et al.

(10) Patent No.: US 9,357,652 B2
(45) Date of Patent: May 31, 2016

(54) METHOD OF MANUFACTURING CIRCUIT BOARD AND SEMICONDUCTOR PACKAGE

(71) Applicant: Samsung Electronics Co., Ltd., Suwon-si (KR)

(72) Inventors: Hee Jeong Kim, Seoul (KR); Yong Kwan Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/568,603

(22) Filed: Dec. 12, 2014

(65) Prior Publication Data

US 2015/0262841 A1   Sep. 17, 2015

(30) Foreign Application Priority Data

Mar. 14, 2014 (KR) .................. 10-2014-0030096

(51) Int. Cl.

| H01L 21/48 | (2006.01) |
|---|---|
| H01L 21/52 | (2006.01) |
| H01L 23/00 | (2006.01) |
| H01L 25/00 | (2006.01) |
| H01L 25/065 | (2006.01) |
| H05K 3/06 | (2006.01) |
| H01L 23/13 | (2006.01) |

(Continued)

(52) U.S. Cl.
CPC ............... *H05K 3/06* (2013.01); *H01L 21/486* (2013.01); *H01L 21/52* (2013.01); *H01L 23/13* (2013.01); *H01L 23/49827* (2013.01); *H01L 24/43* (2013.01); *H01L 24/85* (2013.01); *H01L 25/0657* (2013.01); *H01L 25/50* (2013.01); *H01L 23/145* (2013.01); *H01L 2224/451* (2013.01); *H01L 2225/0651* (2013.01); *H01L 2225/06548* (2013.01); *H01L 2924/00014* (2013.01); *H01L 2924/12042* (2013.01); *H01L 2924/152* (2013.01); *H01L 2924/15153* (2013.01)

(58) Field of Classification Search
USPC .......................................... 257/211; 438/107
See application file for complete search history.

(56) References Cited

U.S. PATENT DOCUMENTS

| 7,348,213 B2 | 3/2008 | Komatsu |
|---|---|---|
| 8,476,111 B2 | 7/2013 | Cho et al. |
| 2007/0087512 A1 | 4/2007 | Cho et al. |
| 2009/0008143 A1 | 1/2009 | Ahn et al. |

(Continued)

FOREIGN PATENT DOCUMENTS

| JP | 2005-243850 A | 9/2005 |
|---|---|---|
| JP | 2007-116155 A | 5/2007 |

(Continued)

*Primary Examiner* — Zandra Smith
*Assistant Examiner* — Lawrence Tynes, Jr.
(74) *Attorney, Agent, or Firm* — Muir Patent Law, PLLC

(57) ABSTRACT

A method of manufacturing a circuit board may include: preparing a circuit board body including an insulating layer having a first surface and a second surface opposite to the first surface and a first conductive thin film layer disposed on the first surface of the insulating layer and having a convex portion which is disposed on a first surface of the first conductive thin film layer and is embedded in the insulating layer; removing the convex portion to form a cavity corresponding to the convex portion in the insulating layer; and forming one or more first wiring patterns on the first surface of the insulating layer by removing first portions of the first conductive thin film layer. The one or more first wiring patterns correspond to second portions of the first conductive thin film layer not removed.

20 Claims, 19 Drawing Sheets

(51) Int. Cl.
    *H01L 23/498*    (2006.01)
    *H01L 23/14*     (2006.01)

(56) References Cited

U.S. PATENT DOCUMENTS

| | | |
|---|---|---|
| 2009/0183903 A1 | 7/2009 | Lee et al. |
| 2010/0126761 A1 | 5/2010 | Park |
| 2014/0252573 A1* | 9/2014 | Lin .................. H01L 24/19 |
| | | 257/666 |

FOREIGN PATENT DOCUMENTS

| | | |
|---|---|---|
| KR | 10-2008-0038719 A | 5/2008 |
| KR | 10-2008-0114052 A | 12/2008 |
| KR | 10-2009-0003880 A | 1/2009 |
| KR | 10-2009-0065474 A | 6/2009 |
| KR | 10-2010-0059417 A | 6/2010 |
| KR | 10-2010-0097913 A | 9/2010 |
| KR | 10-1212525 B1 | 12/2012 |
| KR | 10-2013-0032529 A | 4/2013 |

\* cited by examiner

METHOD OF MANUFACTURING CIRCUIT BOARD AND SEMICONDUCTOR PACKAGE

CROSS-REFERENCE TO RELATED APPLICATION

This application claims the benefit of Korean Patent Application No. 10-2014-0030096 filed on Mar. 14, 2014, in the Korean Intellectual Property Office, the disclosure of which is incorporated herein by reference in its entirety.

BACKGROUND

The present disclosure relates to a method of manufacturing a circuit board and more particularly, to a method of manufacturing a semiconductor package including the circuit board.

In general, a semiconductor package may include a circuit board and a semiconductor device mounted on the circuit board. In accordance with demands for miniaturization and slimness of electronic devices, research has been made with respect to a novel circuit board appropriate for such demands and a method of manufacturing the same efficiently.

SUMMARY

Exemplary embodiments of the present disclosure may provide a method of manufacturing a circuit board facilitating the adjustment of a depth of a cavity and improving process efficiency.

Exemplary embodiments of the present disclosure may also provide a method of manufacturing a semiconductor package using the aforementioned circuit board.

According to an exemplary embodiment of the present disclosure, a method of manufacturing a circuit board includes preparing a circuit board body including a core insulating layer having a first surface and a second surface opposite to the first surface, and a first conductive thin film layer disposed on the first surface of the core insulating layer and having a convex portion which is disposed on a first surface of the first conductive thin film layer and is embedded in the core insulating layer; removing the convex portion to form a cavity corresponding to the convex portion in the core insulating layer; and forming one or more first wiring patterns on the first surface of the core insulating layer by removing first portions of the first conductive thin film layer. The one or more first wiring patterns correspond to second portions of the first conductive thin film layer not removed.

The forming of the cavity may include selectively removing the first conductive thin film layer from a second surface of the first conductive thin film layer that corresponds to a top of the convex portion toward a bottom of the convex portion.

The forming of the cavity and the forming of the first wiring pattern may be performed in a single process.

The first conductive thin film layer may further include a circuit pattern protruding from the first surface thereof on which the convex portion is formed and embedded in the core insulating layer, and the forming of the one or more first wiring patterns may include selectively removing the first conductive thin film layer to retain the circuit pattern.

The forming of the one or more first wiring patterns may include forming the one or more first wiring patterns on the first surface of the core insulating layer or a bottom surface of the cavity.

A depth of the cavity may be defined by a height of the convex portion of the first conductive thin film layer.

The preparing of the circuit board body may include: preparing the core insulating layer; preparing the first conductive thin film layer having the first surface on which the convex portion is formed; and combining the first conductive thin film layer with the core insulating layer to cause the convex portion to be embedded in the core insulating layer.

The core insulating layer may include an uncured resin prior to the combining of the first conductive thin film layer with the core insulating layer, and the uncured resin of the core insulating layer may be cured after the combining of the first conductive thin film layer with the core insulating layer.

The method may further include forming one or more second wiring patterns on the second surface of the core insulating layer.

The forming of the one or more second wiring patterns may include: forming a second conductive thin film layer on the second surface of the core insulating layer; and selectively removing portions of the second conductive thin film layer to form the one or more second wiring patterns.

The core insulating layer may further include a first conductive via electrically connecting one of the first wiring patterns to one of the second wiring patterns.

A second conductive via is included in the core insulating layer and penetrates through a bottom surface of the cavity and the second surface of the core insulating layer.

The method may further include forming a passivation layer on the first surface of the core insulating layer to expose at least one of the first wiring patterns.

According to an exemplary embodiment in the present disclosure, a method of manufacturing a semiconductor package, the method may include: preparing a core insulating layer and a first conductive thin film layer having one surface that forms a convex portion; stacking the first conductive thin film layer on the core insulating layer to dispose the convex portion within the core insulating layer; removing the convex portion to form a cavity corresponding to the convex portion in the core insulating layer; forming a wiring pattern on the core insulating layer from at least a portion of the first conductive thin film layer that remains after the convex portion is removed; and mounting a semiconductor device in the cavity.

According to an exemplary embodiment of the present disclosure, a method of manufacturing a semiconductor package, the method may include: preparing a insulating layer having a first surface and a second surface opposite to the first surface, and a first conductive layer having a first surface that forms a convex portion; combining the first conductive layer with the insulating layer at the first surface of the insulating layer such that the convex portion of the first conductive layer is embedded in the insulating layer; removing the convex portion to form a cavity corresponding to the convex portion in the insulating layer; and mounting a first semiconductor device in the cavity. The one or more first wiring patterns are formed by second portions of the first conductive layer.

BRIEF DESCRIPTION OF DRAWINGS

Exemplary embodiments of the present disclosure will be more clearly understood from the following detailed description taken in conjunction with the accompanying drawings, in which.

DETAILED DESCRIPTION

Figure 1A:
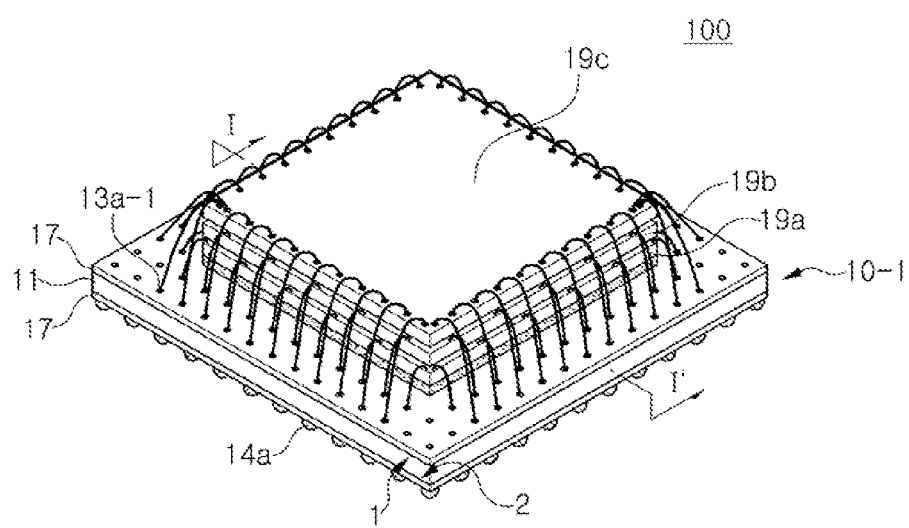
FIGS. 1A and 1B are perspective and cross-sectional views of a semiconductor package using a circuit board according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. In the drawings, the shapes and dimensions of elements may be exaggerated for clarity, and the same reference numerals will be used throughout to designate the same or like elements.

Throughout the specification, unless otherwise defined, the terms "top portion" or "upper portion," "top surface," "bottom portion" or "lower portion," "bottom surface," "side surface," and the like, are based on the directionality of the drawings, which may change according to a direction in which a semiconductor device is actually mounted.

An expression used in the singular encompasses the expression in the plural, unless it has a clearly different meaning in the context. In the present specification, it is to be understood that the terms such as "comprises," "comprising," "includes," and/or "including," when used herein, are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that although the terms "first", "second", etc. may be used herein to describe various components, these components should not be limited by these terms. Unless indicated otherwise, these components are only used to distinguish one component from another. For example, a first component may be a second component, and similarly, the second component may be the first component.

As used herein, the singular terms "a," "an" and "the" are intended to include the plural forms as well, unless the context clearly indicates otherwise. Expressions such as "at least one of," when preceding a list of elements, modify the entire list of elements and do not modify the individual elements of the list. As used herein, the term "and/or" includes any and all combinations of one or more of the associated listed items. It will be understood that when an element is referred to as being "connected" or "coupled" to another element, it may be directly connected or coupled to the other element or intervening elements may be present. The term "contact," as used herein, refers to a direct contact, unless indicated otherwise.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
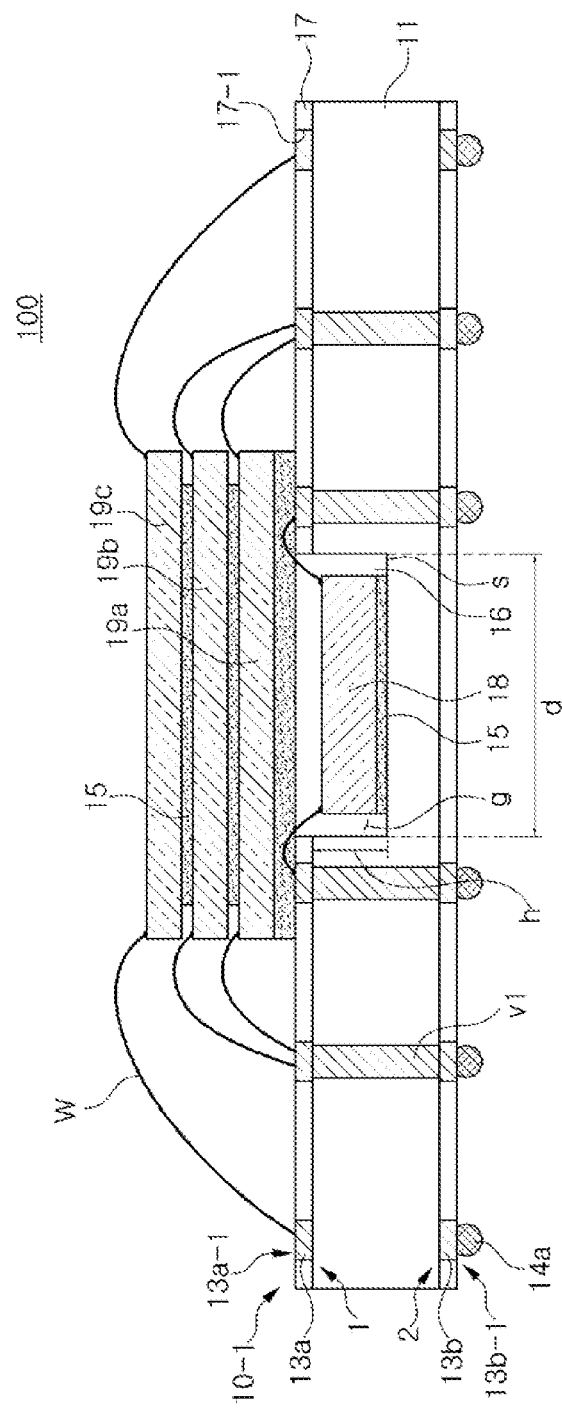

FIG. 1A is a perspective view of a semiconductor package 100 using a circuit board 10-1 according to an exemplary embodiment of the present disclosure, and FIG. 1B is a cross-sectional view of the semiconductor package 100 of FIG. 1A, taken along line I-I' according to an exemplary embodiment.

With reference to FIGS. 1A and 1B, the semiconductor package 100 may include the circuit board 10-1 and one or more semiconductor devices 18, 19a, 19b, and 19c mounted on the circuit board 10-1.

The circuit board 10-1 may include a core insulating layer 11 having a first surface 1 and a second surface 2 opposite to the first surface 1 and first and second wiring patterns 13a and 13b disposed on the first and second surfaces 1 and 2, respectively.

The core insulating layer 11 may include an insulating material to prevent undesired short-circuits of the first and second wiring patterns 13a and 13b. For example, the core insulating layer 11 may include at least one of a prepreg resin, a thermosetting epoxy resin, a thermoplastic epoxy resin, and a resin containing a filler. For example, the core insulating layer 11 may include a prepreg material such as FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester), and the like. However, the material of the core insulating layer 11 is not limited thereto. In certain embodiments, the core insulating layer 11 may be the thickest layer of the circuit board 10-1. The core insulating layer may form the structural formation of the circuit board.

In one embodiment, a cavity g may be formed at the first surface 1 in the core insulating layer 11 to provide a mounting area for the semiconductor device 18. A shape of the cavity g may correspond to that of a convex portion C of a first conductive thin film layer 12a to be described below with reference to FIGS. 3A and 3B. A depth h of the cavity g may be defined by a height h' of the convex portion C.

In one embodiment, the first and second wiring patterns 13a and 13b may be formed of a conductive material. For example, the first and second wiring patterns 13a and 13b may include at least one of copper, aluminum, gold, silver, nickel, palladium, and the like. For example, the first wiring pattern 13a may be formed by selectively removing portions of the first conductive thin film layer 12a. Likewise, the second wiring pattern 13b may be formed by selectively removing portions of a second conductive thin film layer 12b. The processes of forming the wiring patterns will be described in detail below. The first wiring pattern 13a may include first pads 13a-1 to which the semiconductor devices 18, 19a, 19b, and 19c are bonded by using wires or a flip-chip bonding scheme or on which connection terminals for making connections with another semiconductor package are to be disposed. The second wiring pattern 13b may include second pads 13b-1 on which external terminals 14a for external communications are to be disposed.

The external terminals 14a may include, for example, a plurality of solder balls. The plurality of solder balls may be arranged in a grid form, but are not limited thereto. In addition, the external terminals 14a may be provided as conductive bumps, conductive spacers, or a pin grid array (PGA).

The first and second wiring patterns 13a and 13b may be electrically connected to one another through first conductive vias v1 formed in the core insulating layer 11. For example, the first conductive vias v1 may include at least one of copper, aluminum, gold, silver, nickel, palladium, and the like.

A passivation layer 17 may be formed on at least one of the first surface 1 and the second surface 2. The passivation layer 17 may be formed of an insulating material to prevent undesired short-circuits of the first and second wiring patterns 13a and 13b. The passivation layer 17 may cover at least a portion of side and top surfaces of the first and second wiring patterns 13a and 13b and include openings 17-1 exposing the first and second pads 13a-1 and 13b-1. For example, the passivation layer 17 may include a solder resist layer.

In addition, the present exemplary embodiment is not limited thereto, and an additional wiring pattern may be formed between the first and second wiring patterns 13a and 13b inside the core insulating layer 11. This additional wiring pattern may serve as a rewiring layer to simplify the electrical connections between the first and second wiring patterns 13a and 13b.

The semiconductor devices 18, 19a, 19b, and 19c may include the first semiconductor device 18 disposed inside the cavity g and the second semiconductor devices 19a, 19b, and 19c disposed outside the cavity g. The first semiconductor device 18 may be disposed on a bottom surface s of the cavity g and an adhesive layer 15 may be disposed between the first semiconductor device 18 and the bottom surface s of the cavity g to fix the first semiconductor device 18. The adhesive layer 15 may include at least one of a metal paste, an insulating epoxy resin, and insulating tape.

In addition, the cavity g may be filled with an encapsulation part 16 to encapsulate the first semiconductor device 18. The encapsulation part 16 may completely fill a space between the cavity g and the first semiconductor device 18 to protect the first semiconductor device 18. The encapsulation part 16 may include a resin such as an epoxy resin or the like, but is not limited thereto.

The second semiconductor devices 19a, 19b, and 19c may be disposed on the circuit board 10-1 to cover the cavity g. In addition, the plurality of second semiconductor devices 19a, 19b, and 19c may be stacked as illustrated in FIGS. 1A and 1B. For example, the adhesive layer 15 may be disposed between the plurality of second semiconductor devices 19a, 19b, and 19c to firmly fix the same. However, the present inventive concept is not limited thereto.

The first and second semiconductor devices 18, 19a, 19b, and 19c may be electrically connected to the first pads 13a-1 through the wires W, and may communicate with an external device through the external terminals 14a.

The first and second semiconductor devices 18, 19a, 19b, and 19c may include an integrated circuit (IC) device manufactured through a semiconductor manufacturing process. For example, each semiconductor device may include a chip formed from a wafer. Each semiconductor device may be a volatile memory such as a dynamic random access memory (DRAM) and a static random access memory (SRAM), a non-volatile memory such as a flash memory, a logic element, a system-on-chip or the like.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

According to the exemplary embodiments, the first semiconductor device 18 may be a single micro controller controlling driving of the second semiconductor devices 19a, 19b, and 19c, and the second semiconductor devices 19a, 19b, and 19c may be a plurality of memories sequentially stacked. However, the present inventive concept is not limited thereto. The first and second semiconductor devices 18, 19a, 19b, and 19c may be provided as IC devices performing the same function. Alternatively, the second semiconductor devices 19a, 19b, and 19c may be provided as IC devices performing different functions.

According to the present exemplary embodiment, since the first semiconductor device 18 is mounted in the cavity g, the semiconductor package 100 may be miniaturized and slim.

Hereinafter, a method of manufacturing the circuit board 10-1 and the semiconductor package 100 using the circuit board 10-1 according to an exemplary embodiment of the present disclosure will be described.

Figure 2:
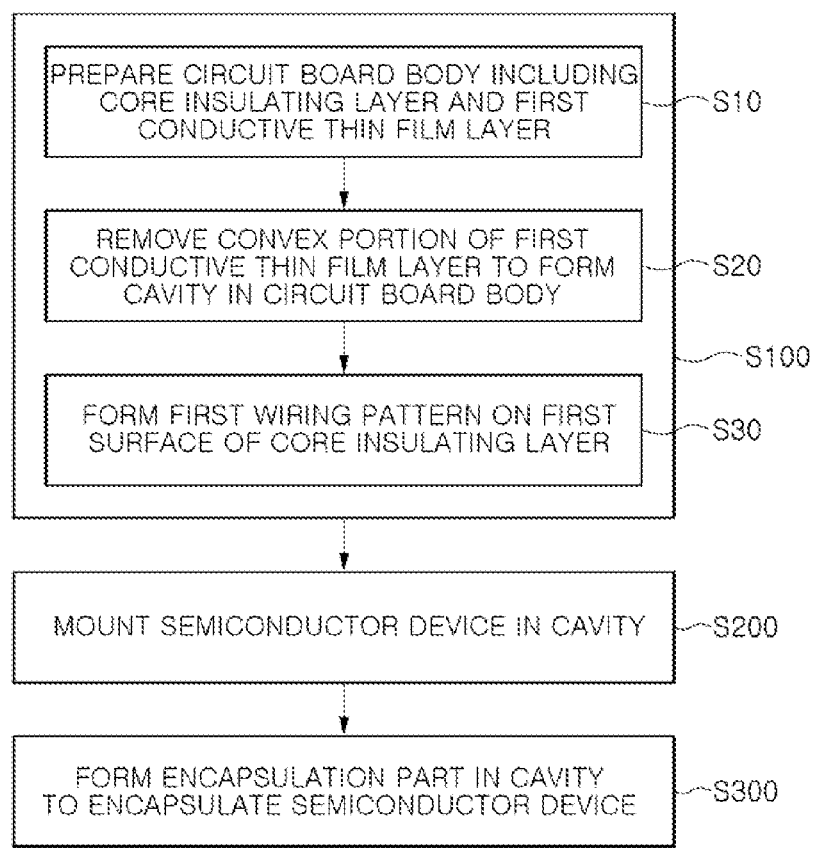
FIG. 2 is a flowchart illustrating a method of manufacturing a circuit board and a semiconductor package using the circuit board according to an exemplary embodiment of the present disclosure.

FIG. 2 is a flowchart illustrating the method of manufacturing the circuit board 10-1 and the semiconductor package 100 using the circuit board 10-1 according to an exemplary embodiment.

With reference to FIG. 2, the method of manufacturing the semiconductor package 100 according to the present exemplary embodiment may include preparing the circuit board 10-1 having the cavity g (S100), mounting the semiconductor device in the cavity g (S200), and forming the encapsulation part 16 inside the cavity g to encapsulate the semiconductor device (S300).

In the preparing of the circuit board 10-1 (S100), a circuit board body 10'-1 may first be prepared (S10).

The circuit board body 10'-1 may include the core insulating layer 11 having the first surface 1 and the second surface 2 opposite to the first surface 1 and the first conductive thin film layer 12a disposed on the first surface 1. The first conductive thin film layer 12a may include the convex portion C, a first surface A, and a second surface B opposite to the first surface A. The convex portion C may be formed on the first surface A of the first conductive thin film layer 12a to be embedded in the core insulating layer 11.

Next, the preparation of the circuit board 10-1 (S100) includes forming the cavity g in the circuit board body 10'-1 (S20). This operation (S20) may include removing the convex portion C. For example, the removal of the convex portion C may result in forming the cavity g corresponding to the convex portion C in the first surface 1. The convex portion C may be removed through an etching process, but is not limited thereto.

In addition, the preparation of the circuit board 10-1 (S100) may include forming the first wiring pattern 13a on the first surface 1 (S30). For example, this step (S30) may include selectively removing portions of the first conductive thin film layer 12a. For example, retained portions of the first conductive thin film layer 12a, not being removed by the etching process, may form the first wiring pattern 13a on the first surface 1. Here, a wet etching process may be employed. However, the present inventive concept is not limited thereto, and a dry etching process may be employed.

The forming of the cavity g (S20) and the forming of the first wiring pattern 13a (S30) may be sequentially performed, but are not limited thereto. For example, the forming of the cavity g (S20) and the forming of the first wiring pattern 13a (S30) may be simultaneously performed in a single process as illustrated in FIGS. 3A through 3F. In this case, process efficiency may be further improved. Alternatively, the forming of the first wiring pattern 13a (S30) may be performed in advance, and the forming of the cavity g (S20) may then be performed.

Hereinafter, processes in the method of manufacturing the circuit board 10-1 and the semiconductor package 100 using the circuit board 10-1 according to an exemplary embodiment of FIGS. 1A and 1B will be described in detail with reference to FIGS. 2 and 3A through 3H.

Figure 3A:
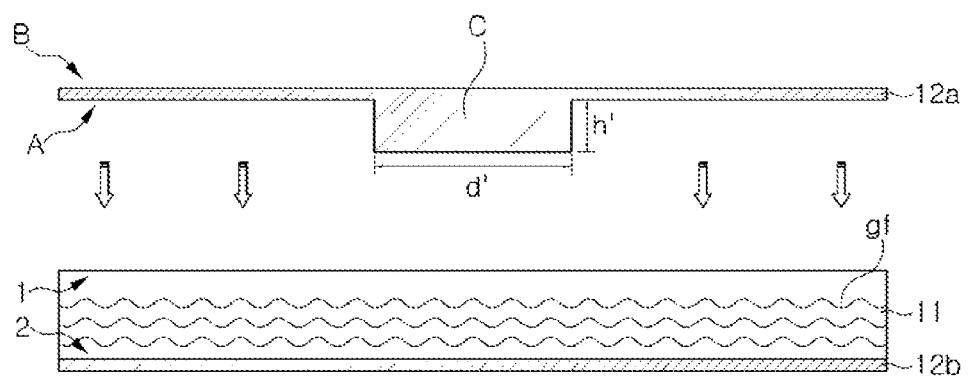
FIGS. 3A through 3H are cross-sectional views illustrating a method of manufacturing the circuit board and the semiconductor package using the circuit board of FIGS. 1A and 1B according to exemplary embodiments.
Figure 3B:
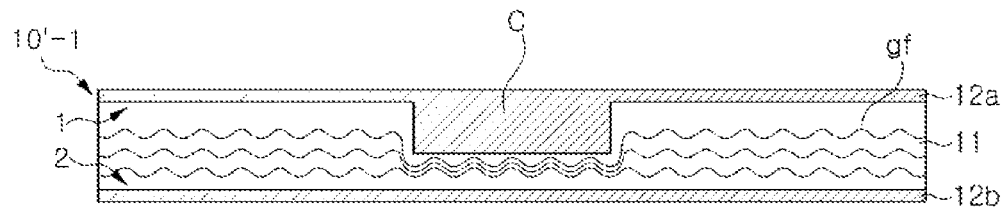
Figure 3C:
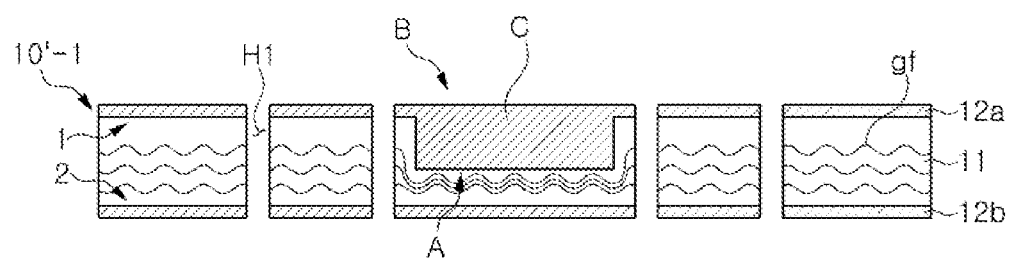
Figure 3D:
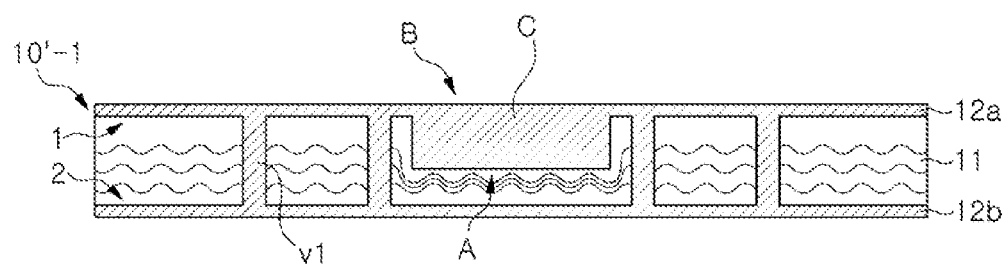
Figure 3E:
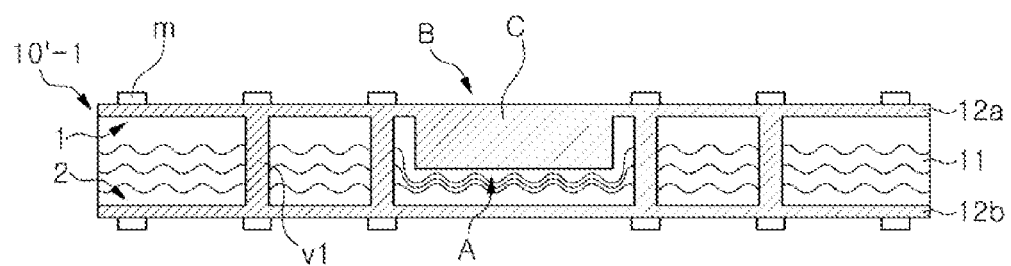
Figure 3F:
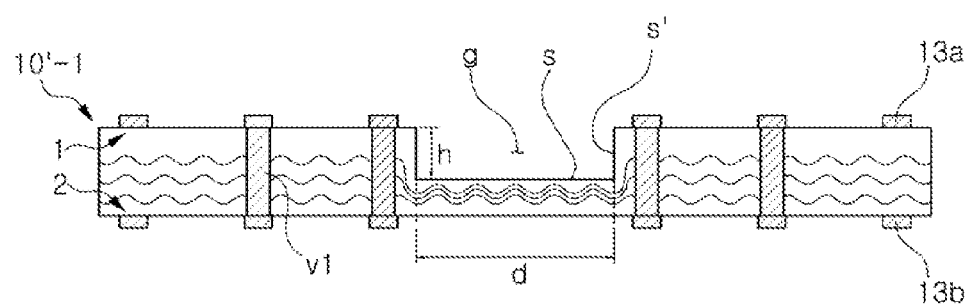
Figure 3G:
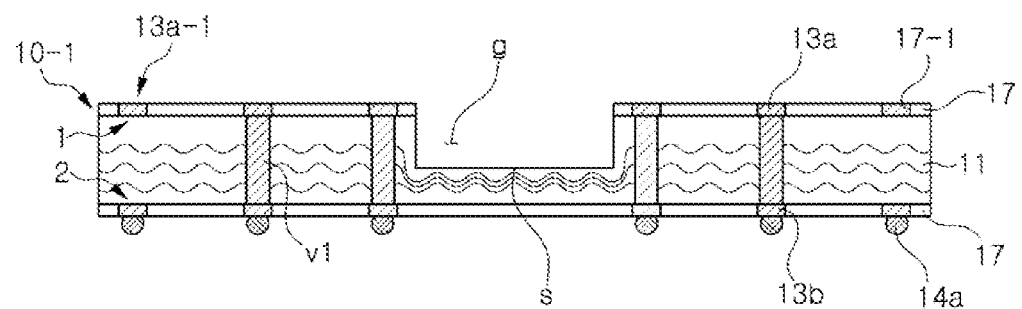
Figure 3H:
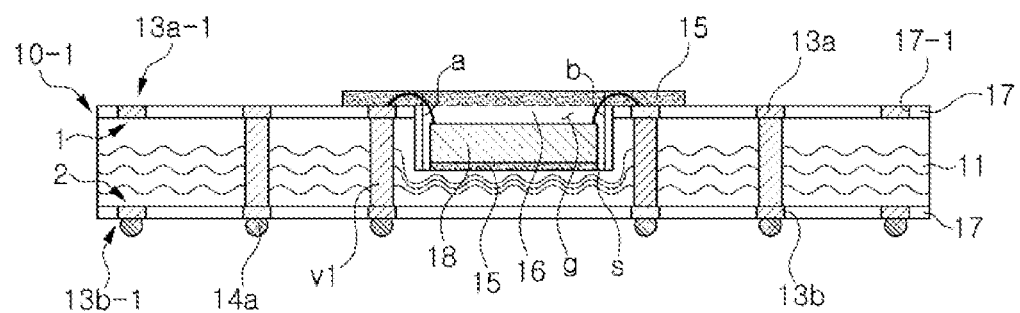

FIGS. 3A through 3G are cross-sectional views illustrating sequential processes in a method of manufacturing the circuit board 10-1 of FIGS. 1A and 1B according to exemplary embodiments, and FIG. 3H is a cross-sectional view illustrating a process of manufacturing the semiconductor package 100 using the circuit board 10-1 according to an exemplary embodiment.

In the method of manufacturing the circuit board 10-1 according to the present exemplary embodiment, the circuit board body 10'-1 may first be prepared (S10) as illustrated in FIGS. 3A and 3B.

The circuit board body 10'-1 may include the core insulating layer 11 having the first surface 1 and the second surface 2 opposite to the first surface 1 and the first conductive thin film layer 12a disposed on the first surface 1. The first conductive thin film layer 12a may include the convex portion C, the first surface A, and the second surface B opposite to the first surface A. The convex portion C may be formed on the first surface A of the first conductive thin film layer 12a and extend from the first surface A to be embedded in the core insulating layer 11. For example, a thickness between the first surface A and a top surface of the convex portion C in a first direction may be referred to as a height h', and a width between a first side surface of the convex portion C and a second side surface opposite to the first side surface in a second direction perpendicular to the first direction may be referred to as a width d'. The convex portion C may have a bottom surface opposite to the top surface of the convex portion C and corresponding to the second surface B. In the present exemplary embodiment, the second conductive thin film layer 12b may be disposed on the second surface 2 of the core insulating layer 11. According to exemplary embodiments, the second conductive thin film layer 12b may be omitted.

For example, the preparation of the circuit board body 10'-1 (S10) may include preparing the core insulating layer 11 having the first surface 1 and the second surface 2 as illustrated in FIG. 3A.

The prepared core insulating layer 11 may be formed of, for example, an insulating resin.

The core insulating layer 11 used in this process may be a semi-cured resin body. The terms "semi-curing" and "semi-cured" used throughout the specification may refer to a state in which a material is not fully cured, but is cured to the extent of having ease of handling and machinability. For example, in a curing reaction, a fully cured resin may be understood as being in a C-stage state in which the cured resin cannot be easily reshaped or molded, while a semi-cured resin may be understood as being in a B-stage state. Such a semi-cured resin body may be compressed at an appropriate temperature, such that it may be desirably deformed and be combined with a compressing object (for example, the first conductive thin film layer 12a). This process will be clearly understood with reference to FIG. 3B.

In the present exemplary embodiment, the core insulating layer 11 may be formed of a prepreg in which a resin is impregnated into glass fiber gf. For example, the glass fiber gf may serve as a reinforcing base material for securing mechanical strength and rigidity of the core insulating layer 11. The glass fiber gf may be at least one of nonwoven glass fiber and woven glass fiber. For example, the use of woven glass fiber having at least one orientation is illustrated in FIGS. 3A through 3H.

The preparation of the circuit board body 10'-1 (S10) may include preparing the first conductive thin film layer 12a having the first surface A on which the convex portion C is provided.

The first conductive thin film layer 12a may include at least one of copper, aluminum, gold, silver, nickel, palladium, and the like. In order to form the convex portion C, various metal molding and/or processing processes may be used. For example, the convex portion C may be formed to have an appropriate height h' and width d' in consideration of a depth h and a width d of the cavity g to be formed in a follow-up process.

The preparation of the core insulating layer 11 and the preparation of the first conductive thin film layer 12a may be performed simultaneously, or either the preparation of the core insulating layer 11 or the preparation of the first conductive thin film layer 12a may be performed in advance.

After the core insulating layer 11 and the first conductive thin film layer 12a are prepared, the first conductive thin film layer 12a and the core insulating layer 11 may be combined with each other to cause the convex portion C to be embedded in the core insulating layer 11. This process may be understood as stacking the first conductive thin film layer 12a on the core insulating layer 11 to dispose the convex portion C inside the core insulating layer 11.

In the present exemplary embodiment, the core insulating layer 11 may be in a semi-cured state before the combining process. In the case in which the convex portion C of the first conductive thin film layer 12a is disposed to protrude towards the first surface 1 and is then compressed, the convex portion C of the first conductive thin film layer 12a may be combined with the core insulating layer 11 to be embedded in the core insulating layer 11 as illustrated in FIG. 3B. In the present exemplary embodiment, in the case in which the glass fiber gf is provided as the woven glass fiber, the glass fiber gf may be dented around the convex portion C as illustrated in FIG. 3B.

The preparation of the circuit board body 10'-1 (S10) may further include curing the semi-cured core insulating layer 11, which completes the preparation of the circuit board body 10'-1 (S10).

Next, the first conductive vias v1 may be formed in the core insulating layer 11 as illustrated in FIGS. 3C and 3D. The first conductive vias v1 may serve to electrically connect the first and second wiring patterns 13a and 13b.

In the present exemplary embodiment, the forming of the first conductive vias v1 may include forming first via holes H1 penetrating through the first surface 1 and the second surface 2 and filling the first via holes H1 with a conductor.

The first via holes H1 may be formed by laser drilling, etching or the like, but are not limited thereto. Here, the first via holes H1 may penetrate through the first and second conductive thin film layers 12a and 12b as well as the first and second surfaces 1 and 2 of the core insulating layer 11, as illustrated in FIG. 3C.

Thereafter, the first via holes H1 may be filled with the conductor as illustrated in FIG. 3D to form the first conductive vias v1. The filling of the first via holes H1 with the conductor may be performed by depositing a conductive material in the first via holes H1, immersing the circuit board body 10'-1 in a plating solution stored in a container, or the like, but is not limited thereto.

Thereafter, the cavity g may be formed in the first surface 1 (S20) and the first wiring pattern 13a may be formed on the first surface 1 (S30). Here, the second wiring pattern 13b may also be formed on the second surface 2.

Meanwhile, the forming of the cavity g (S20) and the forming of the first wiring pattern 13a (S30) may be performed in a single process, which will be described in detail with reference to FIGS. 3E through 3G.

As illustrated in FIG. 3E, a mask m may be formed on the first conductive thin film layer 12a and the second conductive thin film layer 12b. The mask m may be at least one of a photoresist and a hard mask, but is not limited thereto.

The mask m may suppress the etching process on portions of the first and second conductive thin film layers 12a and 12b in which a mask pattern is formed, thereby allowing the portions of the first and second conductive thin film layers 12a and 12b to be retained. The retained portions of the first and second conductive thin film layers 12a and 12b may serve as the first and second wiring patterns 13a and 13b, respectively. To this end, the mask m may be disposed to form patterns on the portions of the first and second conductive thin film layers 12a and 12b corresponding to the first and second wiring patterns 13a and 13b to be formed.

After the forming of the mask m, the first and second conductive thin film layers 12a and 12b may be etched. The removal of the mask m after the etching process is illustrated in FIG. 3F.

With reference to FIG. 3F, portions of the first conductive thin film layer 12a may be selectively removed, and the retained portions thereof may be provided as the first wiring pattern 13a. Likewise, the second wiring pattern 13b may be formed by selectively removing portions of the second conductive thin film layer 12b.

The etching process may be performed to form the cavity g at the first surface 1 within the core insulating layer 11. For example, the cavity g may be formed by removing the convex portion C through the etching process. For example, the forming of the cavity g (S20) may be performed by selectively removing the first conductive thin film layer 12a from a second surface B opposite to the first surface A of the first conductive thin film layer 12a, which does not face the core insulating layer 11 to the convex portion C. For example, the first conductive thin film layer 12a may be selectively etched from the second surface B of the first conductive thin film layer 12a to remove the entirety of the convex portion C.

In one embodiment, the shape of the cavity g may correspond to that of the convex portion C. For example, the cavity g may include the bottom surface s, the depth h, the width d, and side surfaces s'. The bottom surface s of the cavity may correspond to the top surface of the insulating layer at the convex portion C of the conductive thin film layer, the height h may correspond to the height h' of the convex portion C, the width d may correspond to the width d' of the convex portion C, and the side surfaces s' may correspond to the first and second side surfaces of the convex portion C. As such, the depth h and the width d of the cavity g may be defined by the height h' and the width d' of the convex portion C. In one embodiment, the shape of the cavity g may be controlled by appropriately adjusting the height h' and the width d' of the convex portion C. Laser drilling, which can be problematic in terms of depth control, need not be used, and thus, the shape of the cavity g may be controlled with precision and process efficiency may be improved. In addition, since the retained portions of the first conductive thin film layer 12a are used as the first wiring pattern 13a, process efficiency may be further improved.

In one embodiment, in the case in which the core insulating layer 11 is formed of the prepreg including the glass fiber gf, the glass fiber gf may be dented around the cavity g, as illustrated in FIG. 3B. Unlike etching the core insulating layer 11 itself or laser drilling the core insulating layer 11 to form the cavity g, a region of the glass fiber gf that is cut or damaged during the etching process may not be exposed through the side surfaces s' of the cavity g. However, the present inventive concept is not limited thereto. In the circuit board 10-1 manufactured according to the present exemplary embodiment, the cut region of the glass fiber gf may be exposed through the side surfaces s' of the cavity g according to the shape of the core insulating layer 11 or the like.

Next, the passivation layer 17 may be formed on the first and second surfaces 1 and 2, and the external terminals 14a may then be formed to obtain the circuit board 10-1 as illustrated in FIG. 3G.

For example, the passivation layer 17 may include a solder resist layer. The passivation layer 17 may cover the side surfaces of the first and second wiring patterns 13a and 13b and include the openings 17-1 exposing at least a portion of the top surfaces thereof. The first and second wiring patterns 13a and 13b exposed by the openings 17-1 may be provided as the first and second pads 13a-1 and 13b-1, respectively, to be used for electrical connections with the semiconductor devices, another semiconductor package, or the like.

The external terminals 14a may include the plurality of solder balls. The plurality of solder balls may be arranged in a grid form, but are not limited thereto.

Then, a method of manufacturing the semiconductor package 100 using the manufactured circuit board 10-1 will be described with reference to FIG. 3H.

In the present embodiment, the first semiconductor device 18 may be mounted in the cavity g (S200) and the encapsulation part 16 may be formed to encapsulate the semiconductor device in the cavity g (S300).

The first semiconductor device 18 may be fixed to the cavity g through the adhesive layer 15 disposed on the bottom surface s of the cavity g, and may be electrically connected to the first wiring pattern 13a through the wires W connected to the first pads 13a-1.

The encapsulation part 16 may include a resin such as an epoxy resin or the like, and may fill a space inside the cavity g. The encapsulation part 16 may encapsulate and protect the first semiconductor device 18. According to embodiments, while filling the space inside the cavity g, the encapsulation part 16 may be formed to be protruded from the cavity g.

In the present exemplary embodiment, the adhesive layer 15 may be formed on the encapsulation part 16. The adhesive layer 15 may serve to fix the second semiconductor devices 19a, 19b, and 19c. Here, the adhesive layer 15 may be formed of an insulating material. According to embodiments, the adhesive layer 15 may be formed of the same resin as that of the encapsulation part 16.

The encapsulation part 16 and the adhesive layer 15 may provide a space in which the wires W connecting the first semiconductor device 18 and the first pads 13a-1 are disposed. To this end, the sum b of a thickness of the encapsulation part 16 and a thickness of the adhesive layer 15 may be greater than a height between the bottom surface s of the cavity g and the top of the wires W connecting the first semiconductor device 18 and the first pads 13a-1.

In one embodiment, the second semiconductor devices 19a, 19b, and 19c may be stacked on the circuit board 10-1 and be connected through the wires W, whereby the semiconductor package 100 may be manufactured as illustrated in FIGS. 1A and 1B.

Figure 4A:
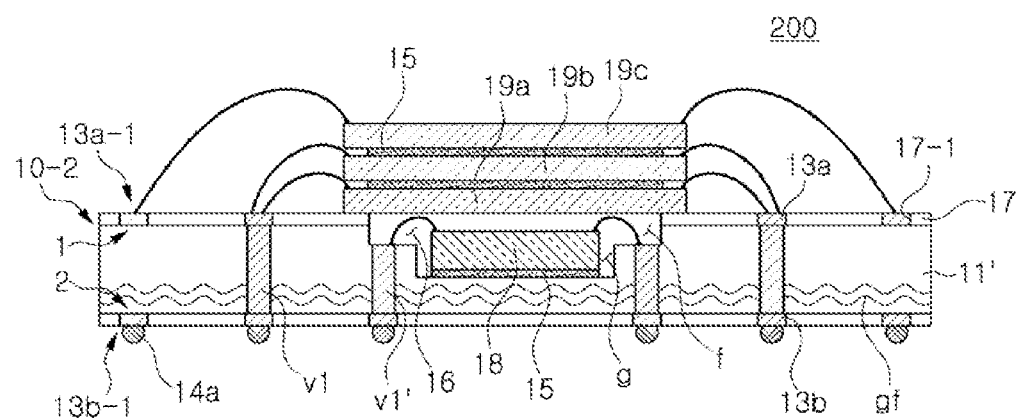
FIGS. 4A and 4B are cross-sectional views illustrating a method of manufacturing a circuit board and a semiconductor package using the circuit board according to other exemplary embodiments.
Figure 4B:
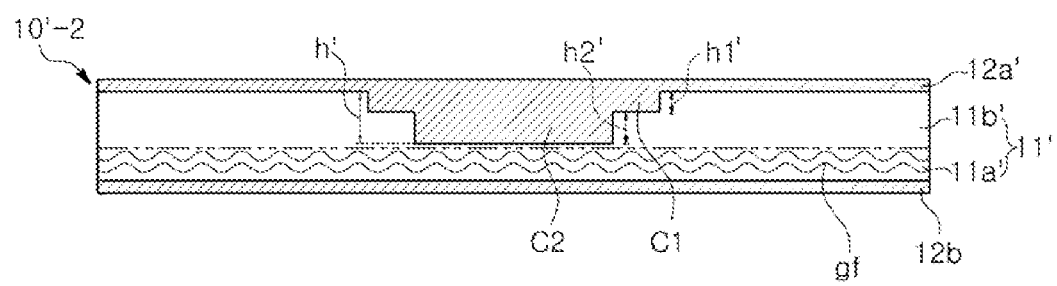

FIGS. 4A and 4B are cross-sectional views illustrating a circuit board 10-2 and a semiconductor package 200 using the circuit board 10-2 according to other exemplary embodiments.

With reference to FIG. 4A, the semiconductor package 200 according to the present exemplary embodiment may include the circuit board 10-2 and one or more semiconductor devices 18, 19a, 19b, and 19c mounted on the circuit board 10-2. The circuit board 10-2 may include a core insulating layer 11' and the first and second wiring patterns 13a and 13b. Hereinafter, the configuration of the semiconductor package, the same as that described in the exemplary embodiment of FIGS. 1A and 1B will be omitted, and different elements will mainly be described.

In the present exemplary embodiment, the core insulating layer 11' may include a recess portion f formed in the first surface 1 and the cavity g formed within the recess portion f and provided as a mounting region for the first semiconductor device 18.

Since first conductive vias v1' connected to the first semiconductor device 18 among the first conductive vias v1 penetrate through the core insulating layer 11' within the recess portion f, the top of the wires W for connecting the first semiconductor device 18 to the first pads 13a-1 may not protrude outwardly from the cavity g like FIGS. 1B and 3H. This may allow the semiconductor package 200 to be miniaturized and slim.

The above-described structure of the circuit board 10-2 may be obtained by using a first conductive thin film layer 12a' having a first convex portion C1 and a second convex portion C2 formed on the first convex portion C1 as illustrated in FIG. 4B. In this case, the cavity g may be formed by etching the second convex portion C2, and the recess portion f may be formed by etching the first convex portion C1.

Thereafter, the circuit board 10-2 and the semiconductor package 200 as illustrated in FIG. 4A may be obtained from a circuit board body 10'-2 of FIG. 4B through the same process as illustrated in FIGS. 3C through 3H.

In the present exemplary embodiment, the core insulating layer 11' may be formed of a prepreg in which a resin is impregnated into glass fiber gf. Here, the prepreg may include two resin layers. For example, the prepreg may include a first resin layer 11a' and a second resin layer 11b'. The first resin layer 11a' may include the glass fiber gf, and the second resin layer 11b' may not include the glass fiber gf. The second resin layer 11b' may be disposed on the first resin layer 11a' and a thickness thereof may be greater than a height h' that is sum of a height h1' of the first convex portion C1 and a height h2' of the second convex portion C2 of the first conductive thin film layer 12a'. For example, even when the cavity g is formed by removing the first and second convex portions C1 and C2, the cut or damaged region of the glass fiber gf may not be exposed through the side surfaces s' of the cavity g.

However, the present inventive concept is not limited thereto. In the circuit board 10-2 manufactured according to the present exemplary embodiment, the cut region of the glass fiber gf may be exposed through the side surfaces s' of the cavity g according to the shape of the core insulating layer 11' or the like.

Figure 5:
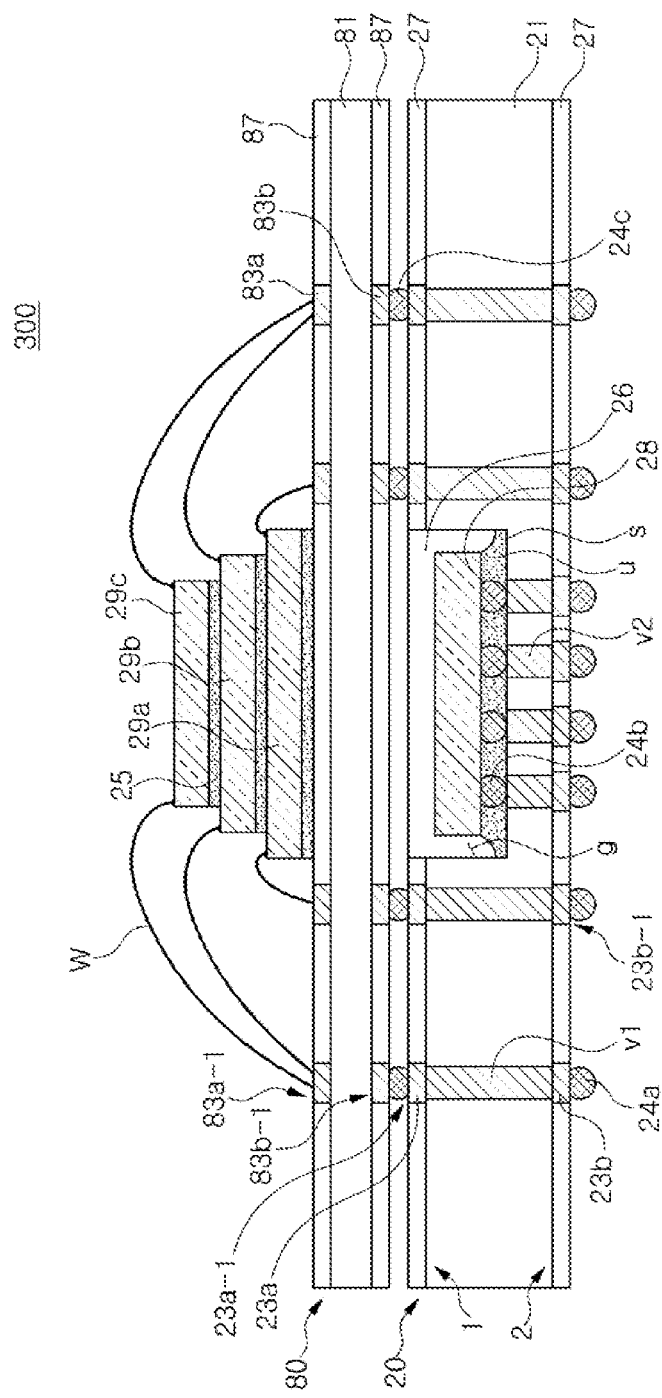
FIG. 5 is a cross-sectional view of a circuit board and a semiconductor package using the circuit board according to an exemplary embodiment of the present disclosure.

FIG. 5 is a cross-sectional view of a circuit board 20 and a semiconductor package 300 using the circuit board 20 according to an exemplary embodiment of the present disclosure. Hereinafter, the configuration of the semiconductor package, the same as that described in the previous embodiments will be omitted, and different elements will mainly be described.

In the present exemplary embodiment, a core insulating layer 21 may further include second conductive vias v2 penetrating through the bottom surface s of the cavity g and the second surface 2, and a first semiconductor device 28 may be mounted in the cavity g through a flip-chip scheme. For example, the first semiconductor device 28 may be electrically connected to the second conductive vias v2 through internal terminals 24b.

In one embodiment, the internal terminals 24b may include a plurality of solder balls, and the second conductive vias v2 may include at least one of, for example, copper, aluminum, gold, silver, nickel, palladium, and the like.

In order to improve reliability in bonding of the first semiconductor device 28, an underfill resin portion u may be formed between the first semiconductor device 28 and the bottom surface s of the cavity g. The underfill resin portion u may be formed of the same material as that of an encapsulation part 26 filling the cavity g.

In the present exemplary embodiment, a separate semiconductor package (hereinafter, referred to as "upper semiconductor package") may be disposed on the circuit board 20. The upper semiconductor package may include an upper circuit board 80 and one or more second semiconductor devices 29a, 29b, and 29c disposed on the upper circuit board 80. The second semiconductor devices 29a, 29b, and 29c may have different sizes and may be stacked using an adhesive layer 25 interposed therebetween, but are not limited thereto.

The upper circuit board 80 may include an upper core insulating layer 81 and upper and lower wiring patterns 83a and 83b. The upper wiring pattern 83a may include upper pads 83a-1 electrically connected to the second semiconductor devices 29a, 29b, and 29c. The lower wiring pattern 83b may include lower pads 83b-1 electrically connected to the circuit board 20 through connection terminals 24c disposed on first pads 23a-1. The upper circuit board 80 may include a passivation layer 87 to prevent undesired short-circuits of the upper and lower wiring patterns 83a and 83b.

As described above, the semiconductor package 300 according to the present exemplary embodiment may be provided as a package-on-package (POP) type semiconductor package.

Hereinafter, a method of manufacturing the circuit board 20 and the semiconductor package 300 using the circuit board 20 according to the exemplary embodiment of FIG. 5 will be described in detail with reference to FIGS. 6A through 6C.

Here, the processes, the same as those illustrated in FIGS. 3A through 3H, will be omitted, and different processes including a process of forming the second conductive vias v2 will be described in detail.

Figure 6A:
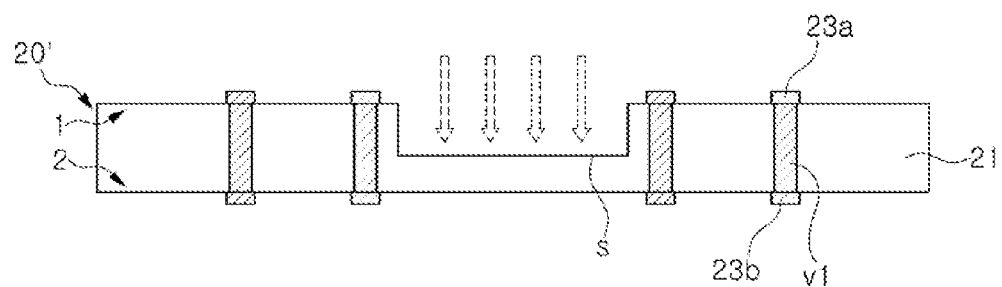
FIGS. 6A through 6C are cross-sectional views illustrating a method of manufacturing the circuit board and the semiconductor package using the circuit board of FIG. 5 according to exemplary embodiments.

FIG. 6A is a cross-sectional view illustrating processes of preparing a circuit board body 20' according to an exemplary embodiment, forming the first conductive vias v1, forming the cavity g corresponding to the convex portion of the first conductive thin film layer 12 in the core insulating layer 21, and forming first and second wiring patterns 23a and 23b.

Then, the second conductive vias v2 may be formed. In the present embodiment, second via holes penetrating through the bottom surface s of the cavity g and the second surface 2 may be formed as illustrated in FIG. 6A. For example, the second via holes may be formed through laser drilling, etching, or the like (refer to arrows in FIG. 6A). After the second via holes are formed, the second via holes may be filled with a conductor to form the second conductive vias v2.

Figure 6B:
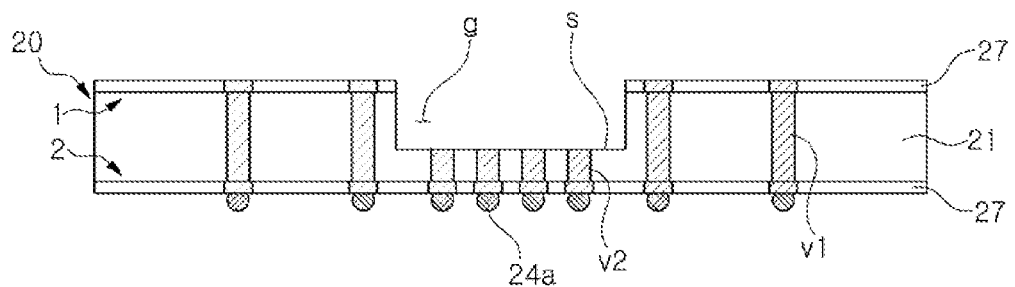
Figure 6C:
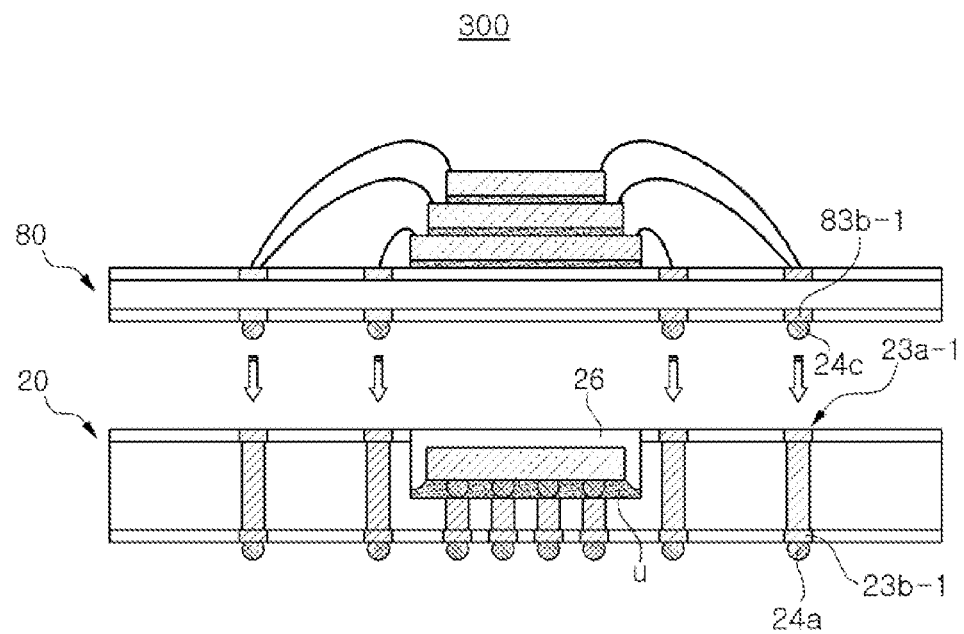

Thereafter, a passivation layer 27 may be formed on the first and second surfaces 1 and 2, and external terminals 24a may be formed to thereby manufacture the circuit board 20 as illustrated in FIG. 6B.

Next, a method of manufacturing the semiconductor package 300 using the manufactured circuit board 20 will be described with reference to FIG. 6C.

This process may include mounting the first semiconductor device 28 in the cavity g (S200) and forming the encapsulation part 26 inside the cavity g to encapsulate the first semiconductor device 28 (S300).

In the present embodiment, the first semiconductor device 28 may be mounted through, for example, a flip-chip scheme. In one embodiment, the underfill resin portion u may be formed between the first semiconductor device 28 and the bottom surface s of the cavity g. The underfill resin portion u may be formed by filling an underfill resin between the first semiconductor device 28 and the bottom surface s of the cavity g prior to forming the encapsulation part 26 inside the cavity g.

However, the forming of the underfill resin portion u is not limited thereto. Without this additional process, the underfill resin portion u may be formed by filling the outside of the first semiconductor device 28 and the space between the first semiconductor device 28 and the bottom surface s of the cavity g with the encapsulation part 26, which is called a MUF (molded underfill) process.

Thereafter, the upper circuit board 80 may be disposed on the circuit board 20 such that the first pads 23a-1 and the lower pads 83b-1 are connected through the connection terminals 24c, whereby the semiconductor package 300 may be manufactured as illustrated in FIG. 5. The semiconductor package 300 may communicate with an external device through the external terminals 24a disposed on second pads 23b-1.

As described above, in the method of manufacturing the circuit board 20 and the semiconductor package 300 using the circuit board 20 according to the present exemplary embodiment, the depth of the cavity g may be easily adjusted and process efficiency may be improved.

Figure 7A:
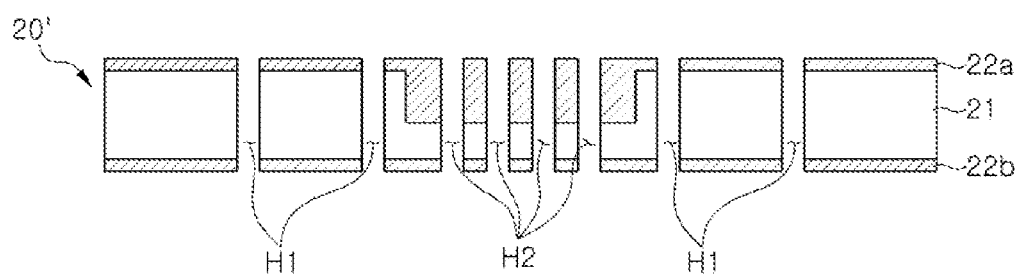
FIGS. 7A and 7B are cross-sectional views illustrating another method of manufacturing the circuit board of FIG. 5 according to exemplary embodiments.
Figure 7B:
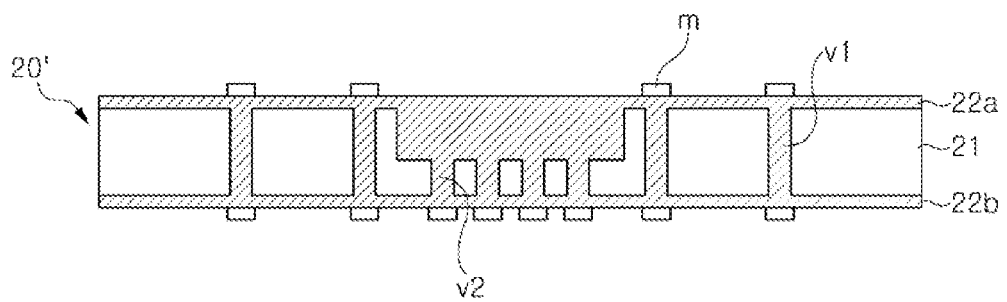

FIGS. 7A and 7B are cross-sectional views illustrating another method of manufacturing the circuit board 20 of FIG. 5 according to exemplary embodiments.

In the forming of the second conductive vias v2 according to the present exemplary embodiment, second via holes H2 may first be formed. Here, the second via holes H2 may be formed, as illustrated in FIG. 7A, after preparing the circuit board body 20' and prior to forming the first and second wiring patterns 23a and 23b. The second via holes H2 may simultaneously be formed together with the first via holes H1 in a single process.

After the forming of the second via holes H2, the second via holes H2 may be filled with a conductor as illustrated in FIG. 7B to thereby form the second conductive vias v2.

Thereafter, a mask m may be formed on the first and second conductive thin film layers 22a and 22b, and the circuit board 20 may be formed to have the first and second wiring patterns 23a and 23b and the first and second conductive vias v1 and v2 through an etching process as illustrated in FIG. 6B. Here, the etching process may be performed by controlling etching time or the like to thereby remove the convex portion C and retain the second conductive vias v2.

Meanwhile, unlike the previous exemplary embodiment, the preparation of the circuit board body 20' according to the present exemplary embodiment may include preparing the core insulating layer 21 to have an uncured resin (A-stage) and the first conductive thin film layer 22a. Thereafter, the core insulating layer 21 may be applied to the first conductive thin film layer 22a and be cured to thereby form the circuit board body.

Hereinafter, details thereof will be provided with reference to FIGS. 8A through 8C.

Figure 8A:
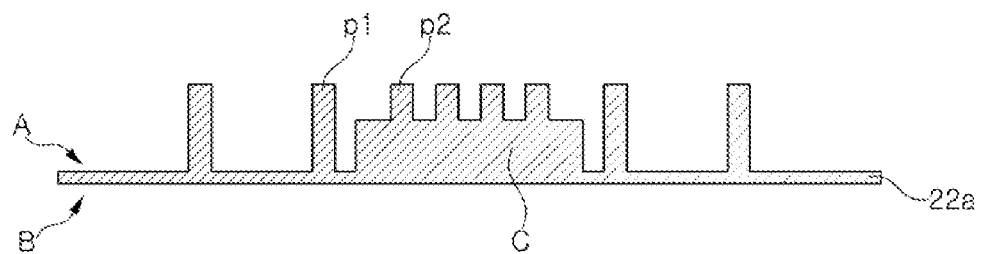
FIGS. 8A through 8C are cross-sectional views illustrating another method of manufacturing the circuit board of FIG. 5 according to exemplary embodiments.
Figure 8B:
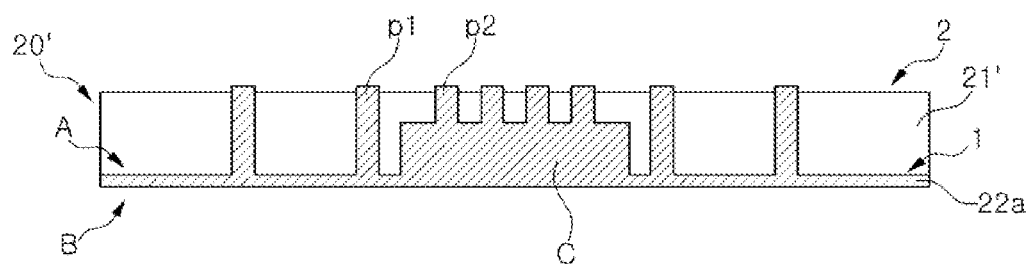
Figure 8C:
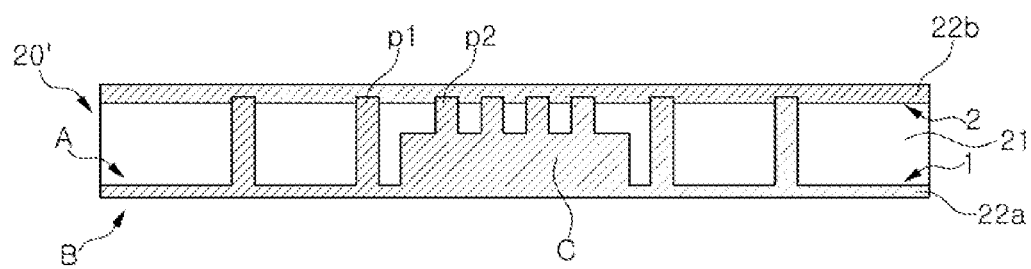

FIGS. 8A through 8C are cross-sectional views illustrating another method of forming the circuit board body 20' and the first and second conductive vias v1 and v2 according to exemplary embodiments.

First of all, the first conductive thin film layer 22a may be prepared to have the convex portion C on a first surface A as illustrated in FIG. 8A. The first conductive thin film layer 22a may include first pillars p1. The convex portion C and the first pillars p1 may be formed on the first surface A of the first conductive thin film layer 22a. The first pillars p1 may be provided as the first conductive vias v1 through a follow-up etching process. In this case, the first pillars p1 may be formed to have a height sufficient to penetrate through the first and second surfaces 1 and 2 of the core insulating layer 21, while a portion thereof is embedded in the core insulating layer 21.

In addition, the first conductive thin film layer 22a may further include second pillars p2 formed on the convex portion C. The second pillars p2 may be provided as the second conductive vias v2 through a follow-up etching process. The second pillars p2 may be formed to have a height sufficient to penetrate through the second surface 2 of the core insulating layer 21, while a portion thereof is embedded in the core insulating layer 21.

Next, a core insulating layer 21' including an uncured resin may be applied to the first conductive thin film layer 22a as illustrated in FIG. 8B. The core insulating layer 21' may be applied to cover portions of the first and second pillars p1 and p2, not covering the entirety thereof. Thereafter, the core insulating layer 21' may be cured to prepare the circuit board body 20'. In the present exemplary embodiment, the cured core insulating layer 21 may have the first surface 1 and the second surface 2 opposite to the first surface 1, and the first surface 1 of the cured core insulating layer 21 is defined as a surface in contact with the first conductive thin film layer 22a.

Then, the second conductive thin film layer 22b may be formed on the second surface 2 of the core insulating layer 21 as illustrated in FIG. 8C. For example, the second conductive thin film layer 22b may be formed on the core insulating layer 21 by a deposition process or the like, but is not limited thereto.

Then, a mask may be formed on the first and second conductive thin film layers 22a and 22b, and an etching process may be performed to form the circuit board 20 having the first and second wiring patterns 23a and 23b and the first and second conductive vias v1 and v2 as illustrated in FIG. 6B.

Figure 9:
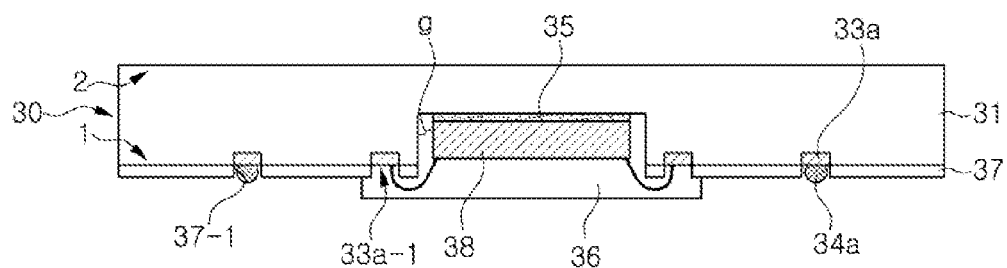
FIG. 9 is a cross-sectional view of a circuit board and a semiconductor package using the circuit board according to an exemplary embodiment of the present disclosure.

FIG. 9 is a cross-sectional view of a circuit board 30 and a semiconductor package 400 using the circuit board 30 according to an exemplary embodiment of the present disclosure.

With reference to FIG. 9, the semiconductor package 400 may include the circuit board 30 and one or more semiconductor devices mounted on the circuit board 30.

The circuit board 30 may include a core insulating layer 31 having a first surface 1 and a second surface 2 opposite to the first surface 1, and a first wiring pattern 33a disposed on the first surface 1. The first wiring pattern 33a may include first pads 33a-1 to which the semiconductor devices are bonded by using wires or a flip-chip bonding scheme or on which external terminals 34a for external communications are to be disposed. The external terminals 34a may include a plurality of solder balls.

In addition, a passivation layer 37 may be formed on the first surface 1 to prevent undesired short-circuits. The passivation layer 37 may cover a portion of the first wiring pattern 33a and include openings 37-1 exposing the first pads 33a-1.

The core insulating layer 31 may have a cavity g formed in the first surface 1 and provided as a mounting region for the semiconductor devices. In one embodiment, a first semiconductor device 38 may be mounted on a bottom surface s of the cavity g. Here, an adhesive layer 35 may be disposed between the bottom surface s of the cavity g and the first semiconductor device 38 to fix the first semiconductor device 38. The cavity g may be filled with an encapsulation part 36 to encapsulate the first semiconductor device 38.

According to the present exemplary embodiment, since the first semiconductor device 38 is mounted in the cavity g, the semiconductor package 400 may be miniaturized and slim. Hereinafter, a method of manufacturing the circuit board 30 and the semiconductor package 400 using the circuit board 30 according to the exemplary embodiment of FIG. 9 will be described with reference to FIGS. 10A through 10D.

FIGS. 10A through 10D are cross-sectional views illustrating a method of manufacturing the circuit board and the semiconductor package using the circuit board of FIG. 9 according to exemplary embodiments.

Unlike the previous exemplary embodiment, the forming of the first wiring pattern 33a (S30) and the forming of the cavity g (S20) in the present exemplary embodiment may be sequentially performed. More specifically, the forming of the first wiring pattern 33a (S30) may be performed prior to the forming of the cavity g (S20).

Figure 10A:
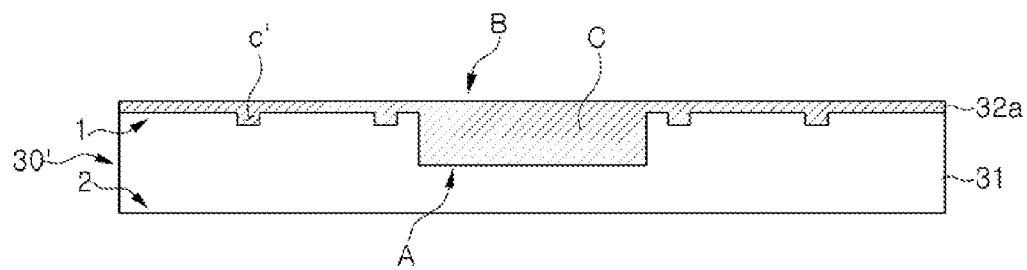
FIGS. 10A through 10D are cross-sectional views illustrating a method of manufacturing the circuit board and the semiconductor package using the circuit board of FIG. 9 according to exemplary embodiments.
Figure 10B:
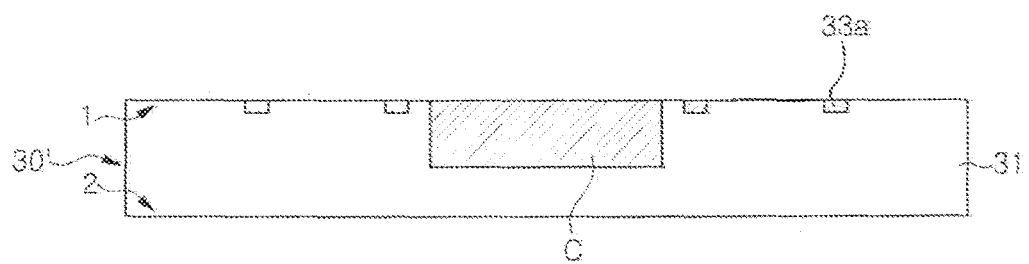

With reference to FIG. 10A, in the forming of the circuit board 30 according to the present exemplary embodiment, a circuit board body 30' may first be prepared to include the core insulating layer 31 having the first surface 1 and the second surface 2 opposite to the first surface 1 and the first conductive thin film layer 32a formed on the first surface 1 and having the convex portion C embedded in the core insulating layer 31 (S10).

In the present exemplary embodiment, the first conductive thin film layer 32a may further include a circuit pattern c' protruding from a first surface A of the first conductive thin film layer 32a, the same surface A on which the convex portion C is provided, and embedded in the core insulating layer 31. The circuit pattern c' may be provided as the first wiring pattern 33a through a follow-up process.

Next, the first wiring pattern 33a may be formed on the first surface 1 (S30). This process may be formed by removing portions of the first conductive thin film layer 32a from a second surface B of the first conductive thin film layer 32a opposite to the first surface A thereof on which the convex portion C is provided until the circuit pattern c' is exposed. For example, the first wiring pattern 33a may be formed by performing an etch-back process on the second surface B of the first conductive thin film layer 32a. Accordingly, the first wiring pattern 33a is formed without a mask, improving process efficiency.

Figure 10C:
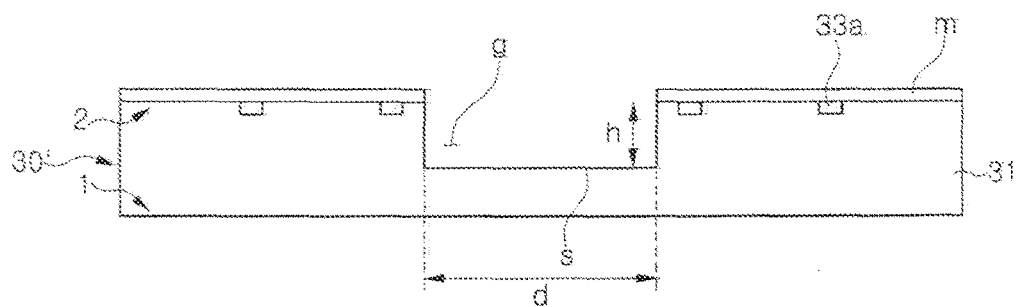

Thereafter, a mask m may be formed on the first wiring pattern 33a as illustrated in FIG. 10C. The convex portion C may be removed to form the cavity g corresponding to the convex portion C in the first surface 1 (S20). Here, the mask m may be disposed on the entirety of the first surface 1 of the core insulating layer 31 including the first wiring pattern 33a, except for a region corresponding to the convex portion C. Therefore, a precise mask pattern need not be used. A width d and a depth h of the cavity g may be appropriately controlled by adjusting a shape of the convex portion C.

Figure 10D:
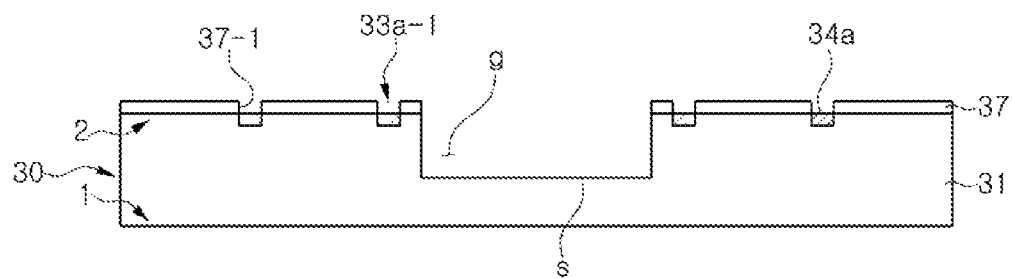

Then, the mask m may be removed and the passivation layer 37 may be formed as illustrated in FIG. 10D. The passivation layer 37 may cover a portion of the first wiring pattern 33a and include the openings 37-1 exposing the first pads 33a-1. The external terminals 34a for external communications may be formed on the first pads 33a-1.

The circuit board 30 according to the present exemplary embodiment may be prepared as described above, and the first semiconductor device 38 may be mounted in the cavity g to thereby manufacture the semiconductor package 400 as illustrated in FIG. 9.

Figure 11:
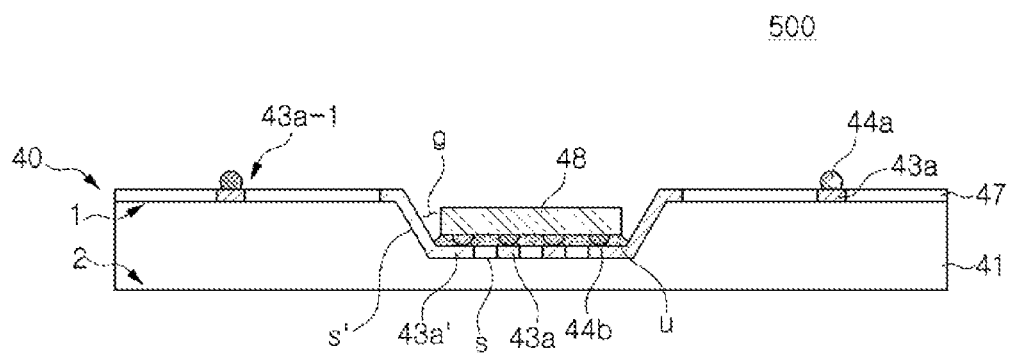
FIG. 11 is a cross-sectional view of a circuit board and a semiconductor package using the circuit board according to an exemplary embodiment of the present disclosure.

FIG. 11 is a cross-sectional view of a circuit board 40 and a semiconductor package 500 using the circuit board 40 according to an exemplary embodiment of the present disclosure. Hereinafter, the configuration of the semiconductor package, the same as that described in the embodiment of FIG. 9 will be omitted, and different elements will mainly be described.

In the present exemplary embodiment, a cavity g may have inclined side surfaces s'. In addition, a first wiring pattern 43a may also be formed on a bottom surface s and the side surfaces s' of the cavity g. For example, the first wiring pattern 43a may include a region 43a' extending from the side surfaces s' of the cavity g to the bottom surface s of the cavity g. For example, a first semiconductor device 48 may be mounted in the cavity g through a flip-chip scheme, and may be electrically connected to the region 43a' of the first wiring pattern 43a extended to the bottom surface s of the cavity g using internal terminals 44b.

Hereinafter, a method of manufacturing the circuit board 40 and the semiconductor package 500 using the circuit board 40 according to the exemplary embodiment of FIG. 11 will be described in detail with reference to FIGS. 12A through 12C.

Figure 12A:
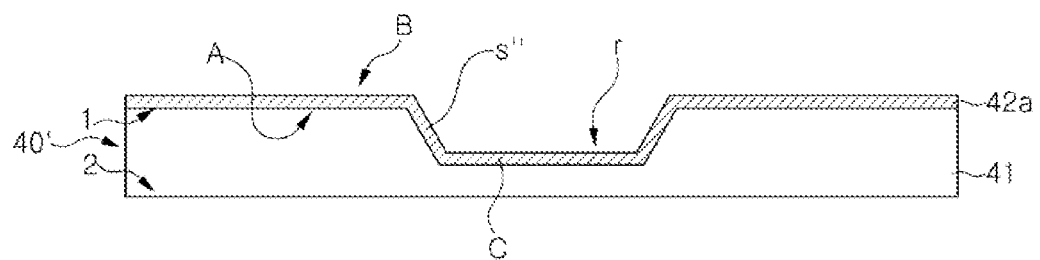
FIGS. 12A through 12C are cross-sectional views illustrating a method of manufacturing the circuit board and the semiconductor package using the circuit board of FIG. 11 according to exemplary embodiments.
Figure 12B:
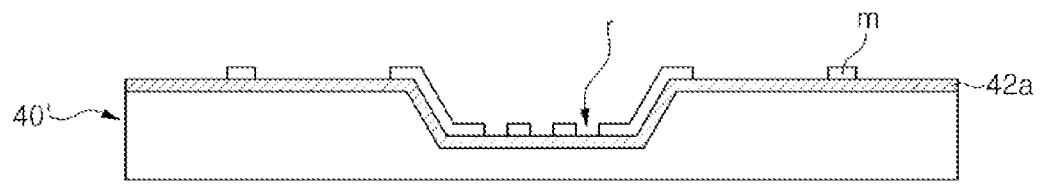
Figure 12C:
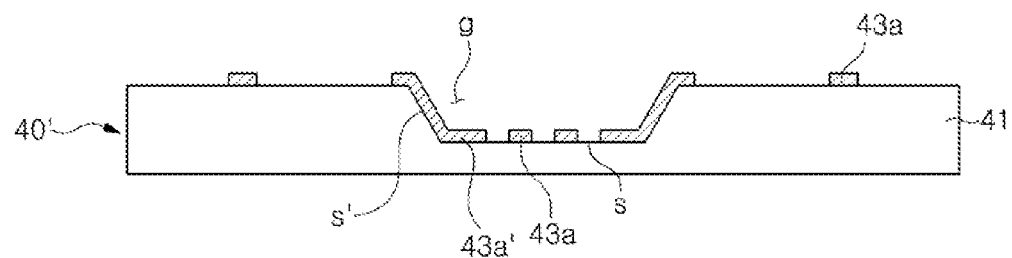

FIGS. 12A through 12C are cross-sectional views illustrating a method of manufacturing the circuit board and the semiconductor package using the circuit board of FIG. 11 according to exemplary embodiments.

First, a circuit board body 40' having a core insulating layer 41 and a first conductive thin film layer 42a may be prepared as illustrated in FIG. 12A. Unlike the previous exemplary embodiments, the first conductive thin film layer 42a may have a concave portion r in a second surface B thereof opposite to a first surface A thereof on which the convex portion C is formed. In addition, the convex portion C may have inclined side surfaces s". The first conductive thin film layer 42a may be prepared by using various metal molding and/or processing processes.

Next, the cavity g may be formed in a first surface 1 of the core insulating layer 41, and the first wiring pattern 43a may be formed.

In order to form the first wiring pattern 43a, a mask m may be formed on the first conductive thin film layer 42a as illustrated in FIG. 12B. The mask m may be formed to have a pattern corresponding to the first wiring pattern 43a. Here, the mask m may also be formed on the concave portion r of the first conductive thin film layer 42a.

Thereafter, portions of the first conductive thin film layer 42a may be selectively removed to form the first wiring pattern 43a and the cavity g in the first surface 1 as illustrated in FIG. 12C. The first wiring pattern 43a may also be formed on the bottom surface s of the cavity g. For example, the first wiring pattern 43a may include the region 43a' extending from the side surfaces s' of the cavity g to the bottom surface s of the cavity g.

Then, the passivation layer 47 may be formed to cover a portion of the first wiring pattern 43a, and external terminals 44a may be formed on first pads 43a-1, whereby the circuit board 40 according to the present exemplary embodiment may be prepared, and the first semiconductor device 48 may be mounted in the cavity g to thereby manufacture the semiconductor package 500 as illustrated in FIG. 11.

Figure 13:
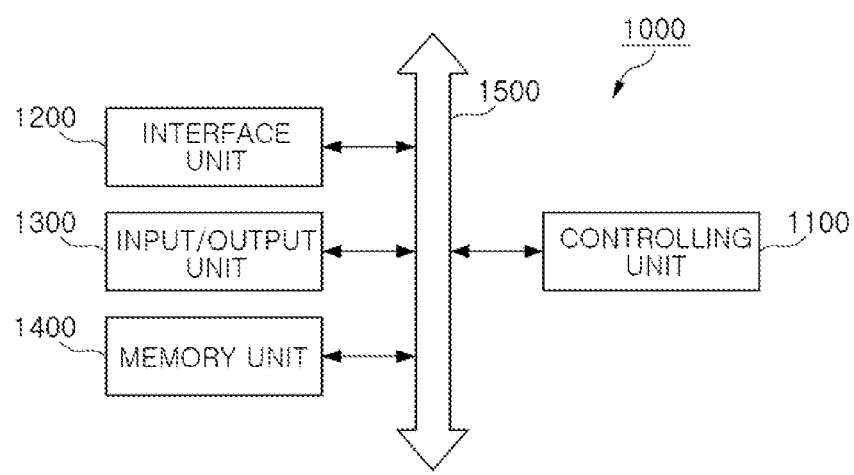
FIGS. 13 and 14 are block diagrams of an electronic device and a storage device according to certain embodiments of the present disclosure.
Figure 14:
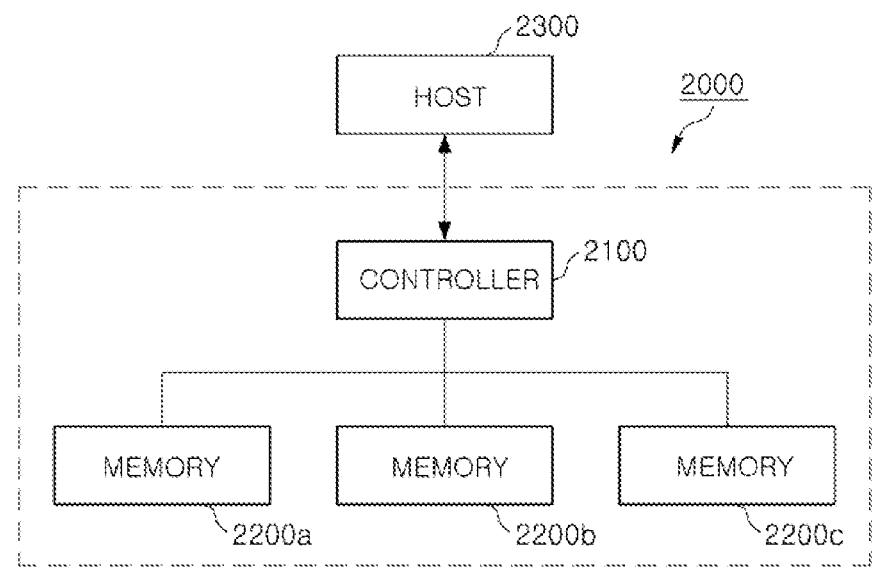

FIGS. 13 and 14 are block diagrams of an electronic device and a storage device according to certain embodiments of the present disclosure.

FIG. 13 illustrates a block diagram illustrating an electronic device 1000 including a semiconductor package such as disclosed above. With reference to FIG. 13, the electronic device 1000 according to the present exemplary embodiment may include, for example, a controlling unit 1100, an interface unit 1200, an input/output unit 1300, and a memory unit 1400. The controlling unit 1100, the interface unit 1200, the input/output unit 1300, and the memory unit 1400 may be connected through a bus 1500 providing a data transfer path.

The controlling unit 1100 may include at least one of a microprocessor, a digital signal processor, a micro controller, and the like. The memory unit 1400 may include an element capable of reading and writing data using various methods. The controlling unit 1100 and the memory unit 1400 may include at least one of the semiconductor packages 100, 200, 300, 400, and 500 according to the aforementioned exemplary embodiments of the present disclosure.

The input/output unit 1300 may include a keypad, a keyboard, a touchscreen, a display device, an audio input/output module, or the like. The interface unit 1200 may be a module for transmitting and receiving data through a communications network, and may include an antenna, a wired/wireless transceiver, or the like. In addition, besides the elements illustrated in FIG. 13, the electronic device 1000 may further include an application chipset, an imaging device, and the like. The category of the electronic device 1000 illustrated in FIG. 13 is not particularly limited, and may include personal digital assistants (PDAs), portable computers (PCs), mobile phones, cell phones, laptop computers, memory cards, portable media players, tablet PCs, and the like.

FIG. 14 is a block diagram illustrating a storage device 2000 including at least one of the semiconductor packages 100, 200, 300, 400, and 500 according to the aforementioned exemplary embodiments of the present disclosure. With reference to FIG. 14, the storage device 2000 according to the present exemplary embodiment may include a controller 2100 communicating with a host 2300 and memories 2200a, 2200b, and 2200c storing data. The controller 2100 and the memories 2200a, 2200b, and 2200c may include at least one of the semiconductor packages 100, 200, 300, 400, and 500 according to the aforementioned exemplary embodiments of the present disclosure. For example, the controller 2100 and the memories 2200a, 2200b, and 2200c may include at least one of the semiconductor packages 100, 200, and 300 as illustrated in FIGS. 1B, 4, and 5.

The host 2300 communicating with the controller 2100 may include various electronic devices in which the storage device 2000 is installed. For example, smart phones, digital cameras, desktop computers, laptop computers, media players, or the like may be the host 2300. Upon receiving a host's request to write or read data, the controller 2100 may generate a command (CMD) to store the data in the memories 2200a, 2200b, and 2200c, or read the data from the memories 2200a, 2200b, and 2200c.

As set forth above, according to exemplary embodiments of the present disclosure, a method of manufacturing a circuit board may be effectively performed by easily controlling a depth of a cavity through improved process efficiency.

In addition, according to exemplary embodiments of the present disclosure, a method of manufacturing a semiconductor package may be effectively performed using the circuit board.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a circuit board, the method comprising:
preparing a circuit board body including a core insulating layer having a first surface and a second surface opposite to the first surface, and a first conductive thin film layer disposed on the first surface of the core insulating layer and having a convex portion which is disposed on a first surface of the first conductive thin film layer and is embedded in the core insulating layer;
removing the convex portion to form a cavity corresponding to the convex portion in the core insulating layer; and
forming one or more first wiring patterns on the first surface of the core insulating layer by removing first portions of the first conductive thin film layer,
wherein the one or more first wiring patterns correspond to second portions of the first conductive thin film layer not removed.

2. The method of claim 1, wherein the forming of the cavity includes selectively removing the first conductive thin film layer from a second surface of the first conductive thin film layer that corresponds to a bottom of the convex portion toward a top of the convex portion.

3. The method of claim 2, wherein the forming of the cavity and the forming of the first wiring pattern are performed in a single process.

4. The method of claim 2, wherein the first conductive thin film layer further includes a circuit pattern protruding from the first surface thereof on which the convex portion is formed and embedded in the core insulating layer, and
wherein the forming of the one or more first wiring patterns includes selectively removing the first conductive thin film layer to retain the circuit pattern.

5. The method of claim 1, wherein the forming of the one or more first wiring patterns includes forming the one or more first wiring patterns on the first surface of the core insulating layer or a bottom surface of the cavity.

6. The method of claim 1, wherein a depth of the cavity is defined by a height of the convex portion of the first conductive thin film layer.

7. The method of claim 1, wherein the preparing of the circuit board body includes:
preparing the core insulating layer;
preparing the first conductive thin film layer having the first surface on which the convex portion is formed; and
combining the first conductive thin film layer with the core insulating layer to cause the convex portion to be embedded in the core insulating layer.

8. The method of claim 7, wherein the core insulating layer includes an uncured resin prior to the combining of the first conductive thin film layer with the core insulating layer, and
wherein the uncured resin of the core insulating layer is cured after the combining of the first conductive thin film layer with the core insulating layer.

9. The method of claim 1, further comprising:
forming one or more second wiring patterns on the second surface of the core insulating layer.

10. The method of claim 9, wherein the forming of the one or more second wiring patterns includes:
forming a second conductive thin film layer on the second surface of the core insulating layer; and
selectively removing portions of the second conductive thin film layer to form the one or more second wiring patterns.

11. The method of claim 9, wherein the core insulating layer further includes a first conductive via electrically connecting one of the first wiring patterns to one of the second wiring patterns.

12. The method of claim 1, wherein a second conductive via is included in the core insulating layer and penetrates through a bottom surface of the cavity and the second surface of the core insulating layer.

13. The method of claim 1, further comprising:
forming a passivation layer on the first surface of the core insulating layer to expose at least one of the first wiring patterns.

14. The method of claim 1, wherein the cavity includes a bottom surface corresponding to the first surface of the insulating layer and on which a first semiconductor device is mounted.

15. A method of manufacturing a semiconductor package, the method comprising:
preparing a core insulating layer and a first conductive thin film layer having one surface that forms a convex portion;
stacking the first conductive thin film layer on the core insulating layer to dispose the convex portion within the core insulating layer;
removing the convex portion to form a cavity corresponding to the convex portion in the core insulating layer;
forming a wiring pattern on the core insulating layer from at least a portion of the first conductive thin film layer that remains after the convex portion is removed; and
mounting a semiconductor device in the cavity.

16. A method of manufacturing a semiconductor package, the method comprising:
preparing a insulating layer having a first surface and a second surface opposite to the first surface, and a first conductive layer having a first surface that forms a convex portion;
combining the first conductive layer with the insulating layer at the first surface of the insulating layer such that the convex portion of the first conductive layer is embedded in the insulating layer;
removing the convex portion to form a cavity corresponding to the convex portion in the insulating layer;
forming one or more first wiring patterns on the first surface of the insulating layer by removing first portions of the first conductive layer; and
mounting a first semiconductor device in the cavity,
wherein the one or more first wiring patterns are formed by second portions of the first conductive layer.

17. The method of claim 16, further comprising:
a second conductive layer contacting the second surface of the insulating layer; and
forming one or more second wiring patterns on the second surface of the insulating layer by removing portions of the second conductive layer.

18. The method of claim 16, further comprising:
forming one or more conductive via layers penetrating through the first surface of the insulating layer and the second surface of the insulating layer,
wherein one of the first wiring patterns electrically connects to one of the second wiring patterns by one of the conductive via layers.

19. The method of claim 18, further comprising:
stacking at least a second semiconductor device on the first semiconductor device,
wherein each of the first and second semiconductor devices is electrically connected to at least one of the conductive via layers and the first and second wiring patterns.

20. The method of claim 16, wherein the convex portion includes a first convex portion and a second convex portion different from the first convex portion, and
wherein second convex portion is formed on the first convex portion or the first surface of the first conductive layer.

* * * * *